United States Patent
Nguyen et al.

(10) Patent No.: US 9,761,416 B2
(45) Date of Patent: Sep. 12, 2017

(54) APPARATUS AND METHODS FOR REDUCING PARTICLES IN SEMICONDUCTOR PROCESS CHAMBERS

(71) Applicant: Applied Materials, Inc., Santa Clara, CA (US)

(72) Inventors: Andrew Nguyen, San Jose, CA (US); Bradley Howard, Pleasanton, CA (US); Shahid Rauf, Pleasanton, CA (US); Ajit Balakrishna, Sunnyvale, CA (US); Tom K. Cho, Los Altos, CA (US); Kenneth S. Collins, San Jose, CA (US); Anand Kumar, Bangalore (IN); Michael D. Willwerth, Campbell, CA (US); Yogananda Sarode Vishwanath, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 631 days.

(21) Appl. No.: 14/200,077

(22) Filed: Mar. 7, 2014

(65) Prior Publication Data
US 2014/0272211 A1    Sep. 18, 2014

Related U.S. Application Data

(60) Provisional application No. 61/790,194, filed on Mar. 15, 2013.

(51) Int. Cl.
*B01D 45/00* (2006.01)
*H01J 37/32* (2006.01)
(Continued)

(52) U.S. Cl.
CPC .. *H01J 37/32495* (2013.01); *H01J 37/32449* (2013.01); *H01J 37/32477* (2013.01);
(Continued)

(58) Field of Classification Search
CPC ........... H01J 37/32495; H01J 37/32449; H01J 37/32871; H01J 37/32477; Y10T 428/13;
(Continued)

(56) References Cited

U.S. PATENT DOCUMENTS

| | | | |
|---|---|---|---|
| 6,770,121 B1 * | 8/2004 | Sindel | B01D 45/08 55/435 |
| 7,674,304 B2 * | 3/2010 | Krell | B01D 1/305 261/112.2 |

(Continued)

*Primary Examiner* — Dung H Bui
(74) *Attorney, Agent, or Firm* — Patterson + Sheridan, LLP

(57) ABSTRACT

Embodiments of the present disclosure generally provide various apparatus and methods for reducing particles in a semiconductor processing chamber. One embodiment of present disclosure provides a vacuum screen assembly disposed over a vacuum port to prevent particles generated by the vacuum pump from entering substrate processing regions. Another embodiment of the present disclosure provides a perforated chamber liner around a processing region of the substrate. Another embodiment of the present disclosure provides a gas distributing chamber liner for distributing a cleaning gas around the substrate support under the substrate supporting surface.

2 Claims, 11 Drawing Sheets

(51) Int. Cl.
  *B01D 45/08* (2006.01)
  *B32B 1/02* (2006.01)
  *B29C 65/00* (2006.01)

(52) U.S. Cl.
  CPC ........ *H01J 37/32871* (2013.01); *B01D 45/08* (2013.01); *B29C 66/71* (2013.01); *B32B 1/02* (2013.01); *Y10T 428/13* (2015.01)

(58) Field of Classification Search
  CPC .. B01D 45/08; B32B 1/08; B32B 1/02; B29C 66/71
  See application file for complete search history.

(56) References Cited

U.S. PATENT DOCUMENTS

| | | | | |
|---|---|---|---|---|
| 8,298,336 B2* | 10/2012 | Wang | ................ | H01J 37/32357 118/715 |
| 9,117,635 B2* | 8/2015 | Satoh | ................... | H01J 37/3244 |
| 2004/0003777 A1* | 1/2004 | Carpenter | ......... | C23C 16/45565 118/715 |
| 2004/0007132 A1* | 1/2004 | Holmes | .................. | B01D 45/08 95/272 |
| 2006/0288934 A1* | 12/2006 | Takahashi | ................ | C23F 4/00 118/715 |
| 2008/0155949 A1* | 7/2008 | Dunsch | .................. | B01D 45/08 55/456 |
| 2009/0019822 A1* | 1/2009 | Feisthammel | ...... | F24C 15/2035 55/385.4 |
| 2009/0217634 A1* | 9/2009 | Choi | ..................... | B01D 45/08 55/426 |
| 2010/0252197 A1* | 10/2010 | Kadkhodayan | ..... | H01J 37/3244 156/345.34 |
| 2012/0247673 A1* | 10/2012 | Hayashi | ............ | H01J 37/32449 156/345.33 |

* cited by examiner

APPARATUS AND METHODS FOR REDUCING PARTICLES IN SEMICONDUCTOR PROCESS CHAMBERS

CROSS-REFERENCE TO RELATED APPLICATIONS

This application claims priority to U.S. Provisional Patent Application Ser. No. 61/790,194, filed on Mar. 15, 2013, which herein is incorporated by reference.

BACKGROUND

Field

Embodiments of the present disclosure relate to apparatus and methods for processing semiconductor substrates. More particularly, embodiments of the present disclosure relate to apparatus and methods for reducing particles generated by mechanical movement in a semiconductor processing chamber.

Description of the Related Art

During manufacturing of semiconductor devices, a substrate is usually processed in a processing chamber, where deposition, etching, thermal processing may be performed to the substrate. One of the reasons causing defects in semiconductor devices is particles generated in the processing chamber. Plasma cleaning may be used to remove particles in the substrate processing regions. However, particles generated in other areas of a processing chamber may not be effectively removed by plasma cleaning. For example, particles generated by mechanical movement of a throttle valve of a vacuum pump, a slit valve door, or by lift pins may present outside the processing area but may enter the processing area due to gas flow, pressure change in the processing chamber or other reasons.

Therefore, there is a need of apparatus and methods for reducing particles generated in areas outside the processing region a semiconductor processing chamber.

SUMMARY

Embodiments of the present disclosure generally provide apparatus and methods for reducing particles in a semiconductor processing chamber.

One embodiment of the present disclosure provides a vacuum screen assembly configured to dispose between a processing chamber and a vacuum pump connected to the processing chamber. The vacuum screen includes a planar body having a first side for facing interior of the processing chamber and a second side for facing the vacuum pump. The planar body includes a plurality of flow paths formed between the first side and the second side, and the plurality of flow paths are formed to reduce line of sight from the second side to the first side.

Another embodiment of the present disclosure provides a chamber liner. The chamber liner includes a bottom, and a sidewall extending from a periphery of the bottom, wherein the sidewall forms a closed loop, a plurality of through holes are formed through a portion of the sidewall, and the remaining portion of the sidewall does not include any through holes.

Yet another embodiment of the present disclosure provides a gas distributing chamber liner. The chamber liner includes a ring section having a plenum formed therein and an inlet port connected with the plenum, and a cylindrical wall section having a first end connected with the ring section and a second end opposite to the first end along a longitudinal axis of the cylindrical wall. A plurality of gas distribution channels are formed in the cylindrical walls substantially parallel to the longitudinal axis, and each of the plurality of gas distribution channels connects between the plenum in the ring section and an outer surface of the cylindrical wall at the second end.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally provide various apparatus and methods for reducing particles in a semiconductor processing chamber.

One embodiment of present disclosure provides a vacuum screen assembly disposed over a vacuum port to prevent particles generated by the vacuum pump from entering substrate processing regions. The vacuum screen assembly may include a plurality of flow paths with reduced or blocked line of sight from the vacuum pump to interiors of the processing chamber. By reducing or blocking the line of sight from the vacuum pump to the interiors of the processing chamber, the vacuum screen assembly provides obstacle surfaces to block paths of travelling particles without significantly reducing efficiency of the vacuum pump.

Another embodiment of the present disclosure provides a perforated chamber liner around a processing region of the substrate. In one embodiment, the perforated chamber liner includes a plurality of through holes that are non-uniformly distributed. The perforated chamber liner functions as a screen between the processing region and other areas, such as the vacuum port, to prevent particles from entering the processing region. Additionally, the distribution of the plurality of the through holes also adjusts fluid flow from the processing region to the vacuum port to improve flow uniformity.

Another embodiment of the present disclosure provides a gas distributing chamber liner for distributing a cleaning gas around the substrate support under the substrate supporting surface. A plasma of the cleaning gas can then be struck to remove particles below the substrate supporting surface.

Vacuum Screen Assembly

Figure 1:
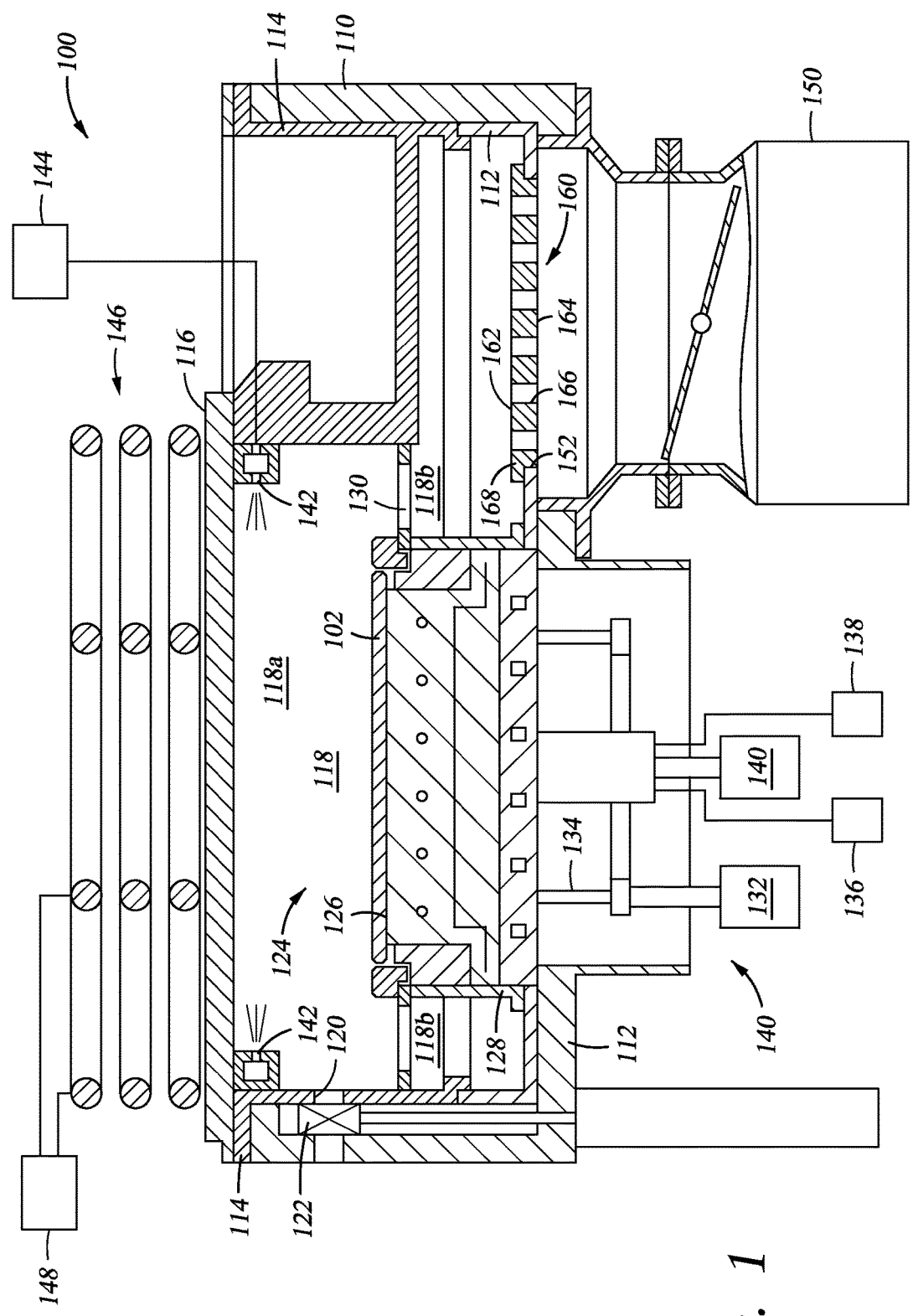
FIG. 1 is a schematic sectional view of a processing chamber having a vacuum screen assembly according to one embodiment of the present disclosure.

FIG. 1 is a schematic sectional view of a processing chamber 100 according to one embodiment of the present disclosure. The processing chamber 100 includes a vacuum screen assembly 160 to reduce particles generated by a vacuum pump. The processing chamber 100 may be configured to process a variety of substrates, such as semiconductor substrates and reticles, and accommodating a variety of substrate sizes.

The processing chamber 100 includes a chamber body 110. A bottom chamber liner 112 and a top chamber liner 114 are disposed inside the chamber body 110. The bottom chamber liner 112, the top chamber liner 114 and a chamber lid 116 define a chamber volume 118. Slit valve openings 118, 120 may be formed through the chamber body 110 and the top chamber liner 114 to allow passage of the substrates and substrate transfer mechanism (not shown). A slit valve door 122 may be disposed to selectively open and close the slit valve openings 118, 120.

A substrate support assembly 124 is disposed in the chamber volume 118. The substrate support assembly 124 has a substrate supporting surface 126 for supporting a substrate thereon. A lift 132 may be coupled to lifting pins 134 to raise the substrate 102 from and to lower the substrate 102 on to the substrate support assembly 124. The substrate support assembly 124 may be an electrostatic chuck coupled to a chucking power source 136 to secure the substrate 102 thereon. The substrate support assembly 124 may also include one or more embedded heating elements coupled to a heating power source 138 for heating the substrate 102 during processing. A cooling fluid source 140 may provide cooling or heating and adjust temperature profile of the substrate 102 being processed.

A substrate support liner 128 surrounds the substrate support assembly 124 to shield the substrate support assembly 124 from processing chemistry. A plasma screen 130 is disposed above the substrate support liner 128. The plasma screen 130 may be positioned at a vertical level similar to the vertical level of the substrate supporting surface 126 and separates the processing volume 118 into a processing volume 118a located above the plasma screen 130 and a lower volume 118b located below the plasma screen 130.

A plurality of nozzles 142 are positioned around an edge region of the processing volume 118a. The plurality of nozzles 136 may be connected to a gas delivery system 144 and configured to inject one or more processing gases to the processing volume 118a.

The processing chamber 100 may also include an antenna assembly 146 for generating a plasma inside the processing chamber 100. The antenna assembly 146 may be coupled to a power source 148. In one embodiment, the antenna assembly 146 is configured to generate inductively coupled plasma in the processing chamber 100.

A vacuum pump 150 is in fluid communication with the inner volume 118 to maintain a low pressure environment within the inner volume 118. In one embodiment, the vacuum pump 150 may be coupled to the inner volume 118 through a vacuum port 152 formed in the bottom chamber liner 112. In one embodiment, the vacuum pump 150 may include a throttle valve for adjusting the vacuum level.

As shown in FIG. 1, the vacuum pump 150 is positioned side by side (i.e., laterally offset) with the substrate support assembly 124, thus, non-symmetrical relative to the substrate 102 on the substrate support assembly 124. The plasma screen 130 includes a plurality of non-evenly distributed openings along a periphery of the substrate support assembly 124 to azimuthally equalize the gas flow from the processing volume 118a to the lower volume 118b. The vacuum port 152 is positioned at a bottom of the lower volume 118b, and laterally offset from the substrate support assembly 124. The vacuum pump 150 pumps out gas and process by products from the processing volume 118a through the vacuum port 152, the lower volume 118b and the openings in the plasma screen 130.

The vacuum screen assembly 160 is disposed in the vacuum port 152 to prevent particles generated by the vacuum pump 150, for example particles generated by the throttle valve from entering the lower volume 118b and the processing volume 118a. In one embodiment, the vacuum screen assembly 160 includes a planar body 168 having a first side 162 facing the lower volume 118b and a second side 164 facing the vacuum pump 150. A plurality of flow paths 166 are formed through the planar body 168 connecting the first side 162 and the second side 164.

In one embodiment, the plurality of flow paths 166 are formed to reduce the line of sight from the second side 164 to the first side 162 to which assists and prevents particles moving from the second side 164 to the first side 162. The plurality of flow paths 166 may be in any suitable form for reducing the line of sight from the second side 164 to the first side 162. For example, the plurality of flow paths 166 may be through holes tilted relative to a central axis of the planar body 168, through holes having wide openings on the second side 164 and narrow openings on the first side 162. Additional exemplary embodiments of the plasma screen assembly are described with FIGS. 2A-FIG. 5 below.

Figure 2A:
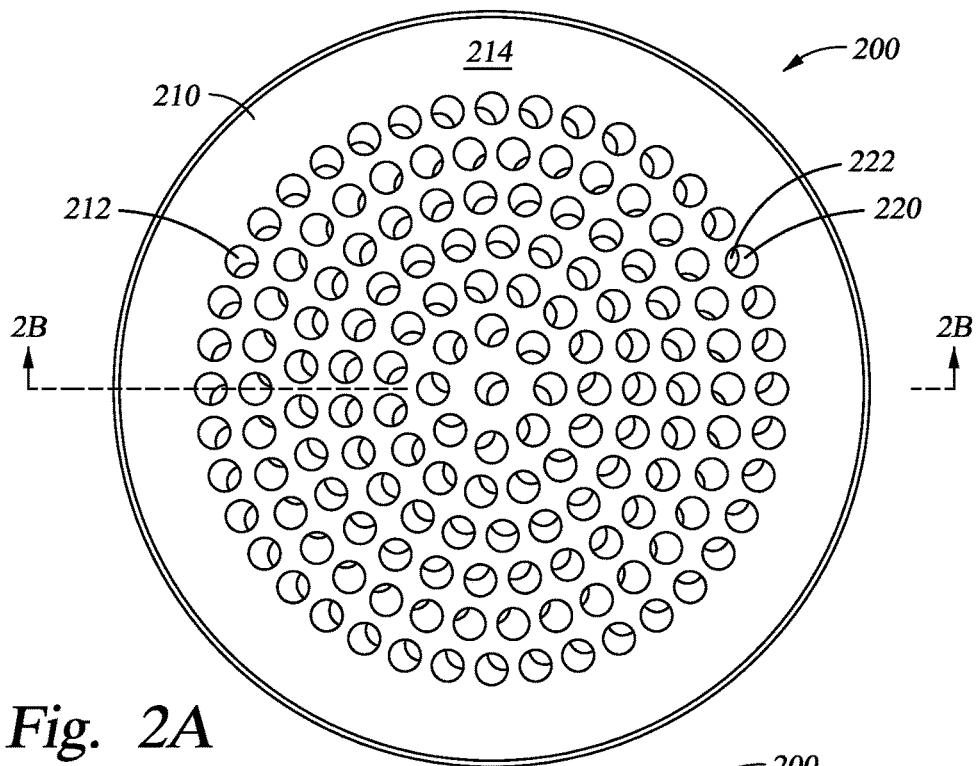
FIG. 2A is a schematic top view of a vacuum screen assembly according to one embodiment of the present disclosure.
Figure 2B:
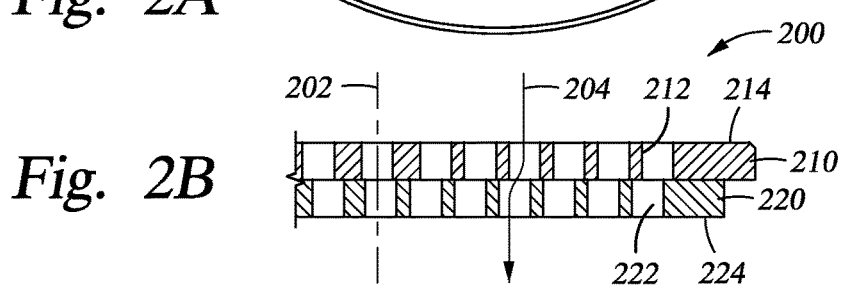
FIG. 2B is a sectional side view of the vacuum screen assembly of FIG. 2A.

FIG. 2A is a schematic top view of a vacuum screen assembly 200 according to one embodiment of the present disclosure. FIG. 2B is a sectional side view of the vacuum screen assembly 200. The vacuum screen assembly 200 may be used in the similar manner as the screen assembly 160 described above.

The vacuum screen assembly 200 includes two plates 210, 220 stacked together with a surface 214 of the plate 210 and a surface 224 of the plate 220 facing outwards. The plates 210, 220 may be planar and parallel to each other. The planar plate 210 has a plurality of through holes 212 and the planar plate 220 has a plurality of through holes 222. Each of the plurality of through holes 212 corresponds to a respective one of the plurality of through holes 222 to form a flow path 204 therethrough. In one embodiment, the plurality of through holes 212 and the plurality of through holes 222 are slightly misaligned to reduce the line of sight from the surface 224 to the surface 214.

In the embodiment shown in FIGS. 2A-2B, the centerlines of through holes 212 and 222 are straight (i.e., parallel with respect to a central axis 202 of the planar plates 210, 220). Alternatively, the through holes 212 and 222 may be tilted at an acute angle with respect to the central axis 202.

Figure 2C:
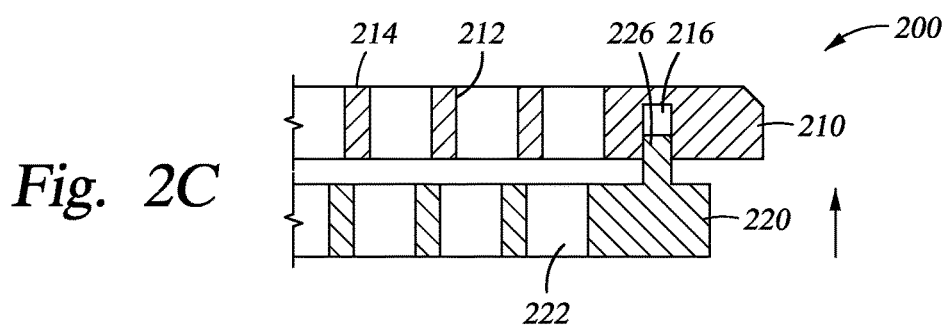
FIG. 2C is an enlarged sectional side view of the vacuum screen assembly of FIG. 2A showing details of connection.

FIG. 2C is an enlarged sectional side view of the vacuum screen assembly 200 of FIG. 2A showing details of connection. The planar plate 210 may have two or more receiving openings 216 and the planar plate 220 may have two or more protrusions 226 mating the receiving opening 216 to provide guide for alignment between the planar plates 210, 220.

Figure 2D:
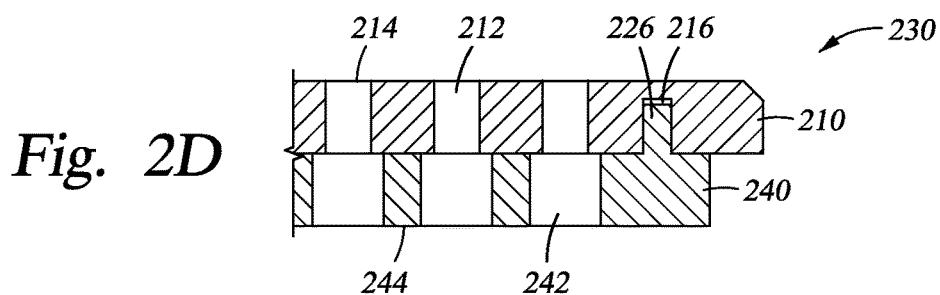
FIG. 2D is a schematic sectional section side view of a vacuum screen assembly according to another embodiment of the present disclosure.

FIG. 2D is a schematic sectional section side view of a vacuum screen assembly 230 according to another embodiment of the present disclosure. The vacuum screen assembly 230 includes a planar plate 240 having a plurality of through holes 242 aligned with the plurality of through holes 212 in the planar plate 210. Each through hole 242 is larger in size than each through hole 212 producing a reduced line of sight from a surface 244 to the surface 214, i.e., from the vacuum pump 150 back toward the substrate support assembly 124.

Figure 3A:
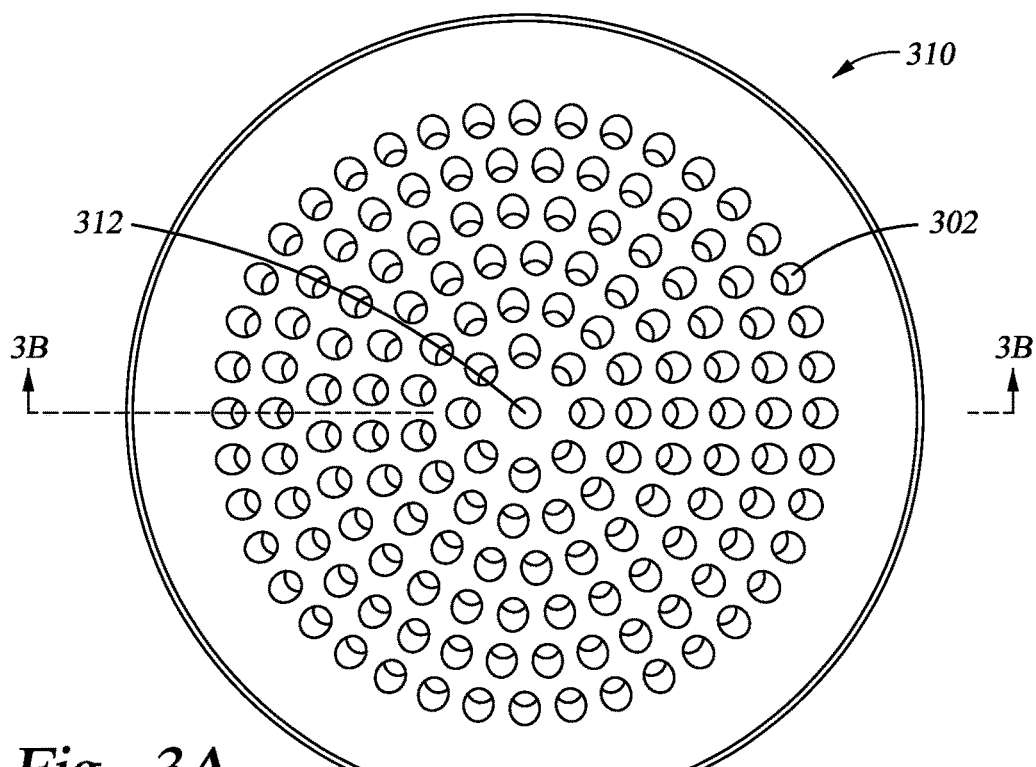
FIG. 3A is a planar plate according one embodiment of the present disclosure.

FIG. 3A is a schematic top view of a planar plate 310 according to one embodiment of the present disclosure. The planar plate 310 has a plurality of through holes 302. The centerlines of each of the plurality of through holes 302 may be inclined at an angle with respect to a central axis 312. In one embodiment, the plurality of through holes 302 are disposed at the same inclined angle with respect to the central axis 321, thus being radially symmetrical about the central axis 312. The inclined angle of the plurality of through holes 302 reduces lines of sight from one side of the plate 310 to the other.

In one embodiment, the planar plate 310 may be used alone to function as a vacuum screen to reduce particles. In other embodiments, two or more planar plates 310 may be alternatively stacked to form a vacuum screen assembly having non-linear flow paths.

Figure 3B:
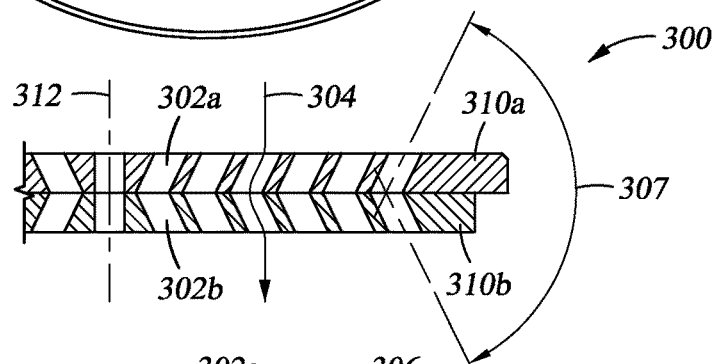
FIG. 3B is a schematic top view of a vacuum screen assembly according to one embodiment of the present disclosure.

FIG. 3B is a sectional side view of a vacuum screen assembly 300 according one embodiment of the present disclosure. The vacuum screen assembly 300 has two planar plates 310a, 310b stacked together. The planar plates 310a, 310b are similar to the planar plate 310 of FIG. 3A. Through holes 302a, 302b of the planar plate 310a, 310b are arranged in the same pattern where pairs of through holes 302a, 302b at least partially align to form flow path 304 through the vacuum screen assembly 300. In one embodiment, the inclination of the centerlines of one or more pairs of through holes 302a, 302b of the planar plate 310a, 310b are positioned in opposite orientation so that the through holes 302a, 302b form a flow path having a chevron shape. In one embodiment, the angle 307 of the flow path 304 is about 60°.

Figure 3C:
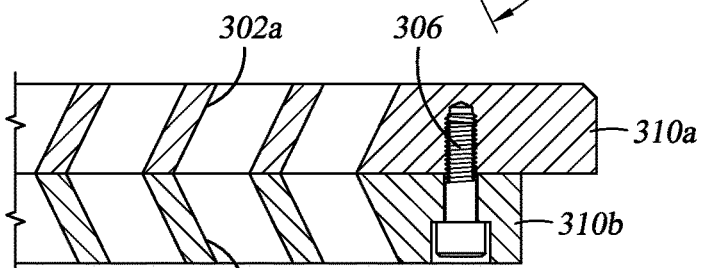
FIG. 3C is an enlarged sectional side view of the vacuum screen assembly of FIG. 3B showing details of connection.

FIG. 3C is an enlarged sectional side view of the vacuum screen assembly 300 of FIG. 3B showing details of connection. Screws 306 may be used to align and secure the planar plates 310a, 310b together.

Figure 3D:
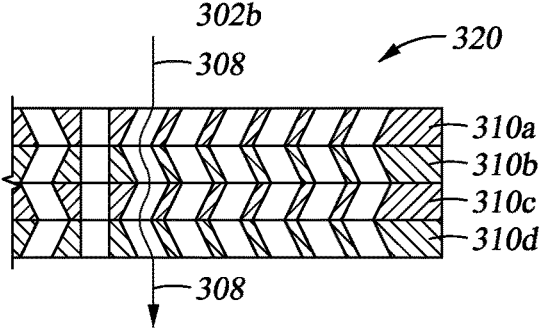
FIG. 3D is a schematic sectional section side view of a vacuum screen assembly according to another embodiment of the present disclosure.

FIG. 3D is a schematic sectional section side view of a vacuum screen assembly 320 according to another embodiment of the present disclosure. The vacuum screen assembly 320 includes a plurality of plates, shown as planar plates 310a, 310b, 310c, 310d stacked together and having holes alternately oriented to form a labyrinth or zigzagging flow paths 308. The zigzagging flow paths 308 provide additional particle blocking surfaces.

Figure 4A:
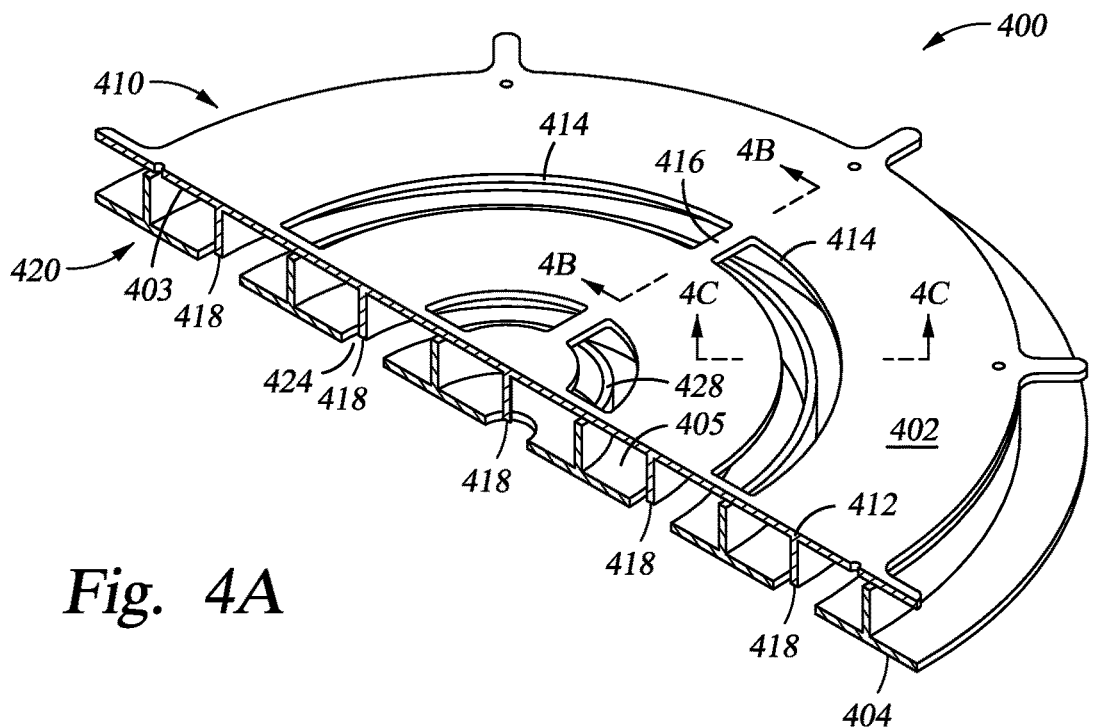
FIG. 4A is a schematic perspective sectional view of a vacuum screen assembly according to one embodiment of the present disclosure.

FIG. 4A is a schematic perspective sectional view of a vacuum screen assembly 400 according to one embodiment of the present disclosure. The vacuum screen assembly 400 defines plurality of flow paths and provides particle blocking surfaces with between cut-outs and ribs. The cut-outs and ribs may be formed in a single plate, or may be formed between stacked plates.

In the embodiment of FIG. 4A, the vacuum screen assembly 400 includes a top plate 410 and a bottom plate 420. The top plate 410 has a substantially planar surface 402 and a plurality of cut-outs 414 formed therethrough. The top late 410 also has a plurality of ribs 418 extending from a surface 403 facing the bottom plate 420. The plurality of cut-outs 414 are positioned between the ribs 418. In one embodiment, the plurality of cut-outs 414 may form two or more concentric circular groups, and the cut-outs 414 in each group are separated by fingers 416. The bottom plate 420 is similar to the top plate 410. The bottom plate 420 has a substantial planar surface 404 and a surface 405 facing the top plate 410. A plurality of cut-outs 424 are formed through the bottom plate 420 and a plurality of ribs 428 extend from the surface 405 towards the top plate 410. The plurality of cut-outs 424 in the bottom plate 420 are positioned to align with the plurality of ribs 418 of the top plate 410. The plurality of ribs 428 of the bottom plate 420 are positioned to align with the plurality of cut-outs 414 in the top plate 410.

Figure 4B:
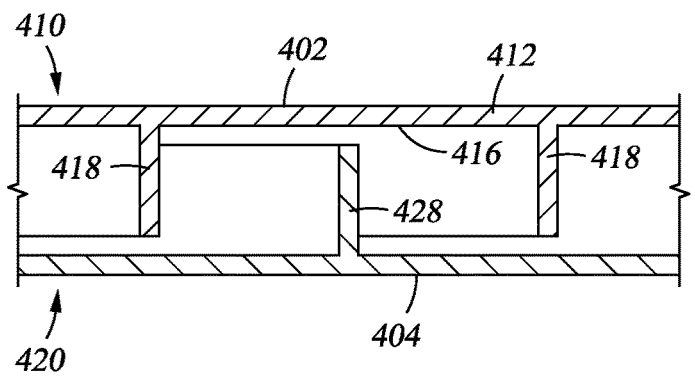
FIGS. 4B-4C are partial sectional views of the vacuum screen assembly of FIG. 4A.
Figure 4C:
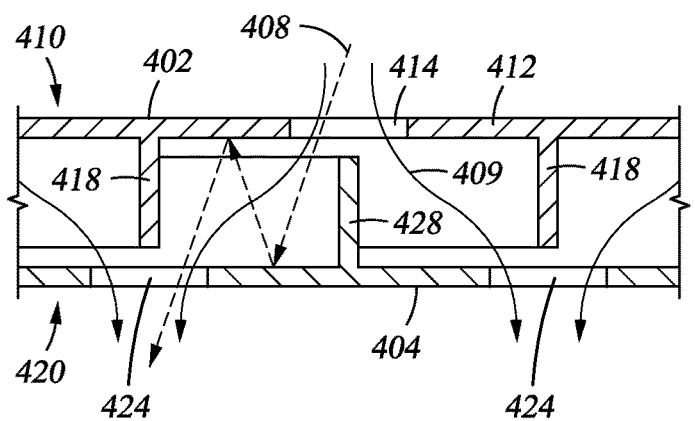

FIG. 4B is partial sectional view of the vacuum screen assembly 400 showing the fingers 416 in the top plate 410. FIG. 4C is a partial sectional view of the vacuum screen assembly 400 showing labyrinth flow paths 409 and theoretical particle paths 408 defined between the top plate 410 and the bottom plate 420. The labyrinth flow path 409 causes the particles to strike the vacuum screen assembly 400 in or more places so that most of the particles are captured prior to exit the vacuum screen assembly 400.

Figure 5:
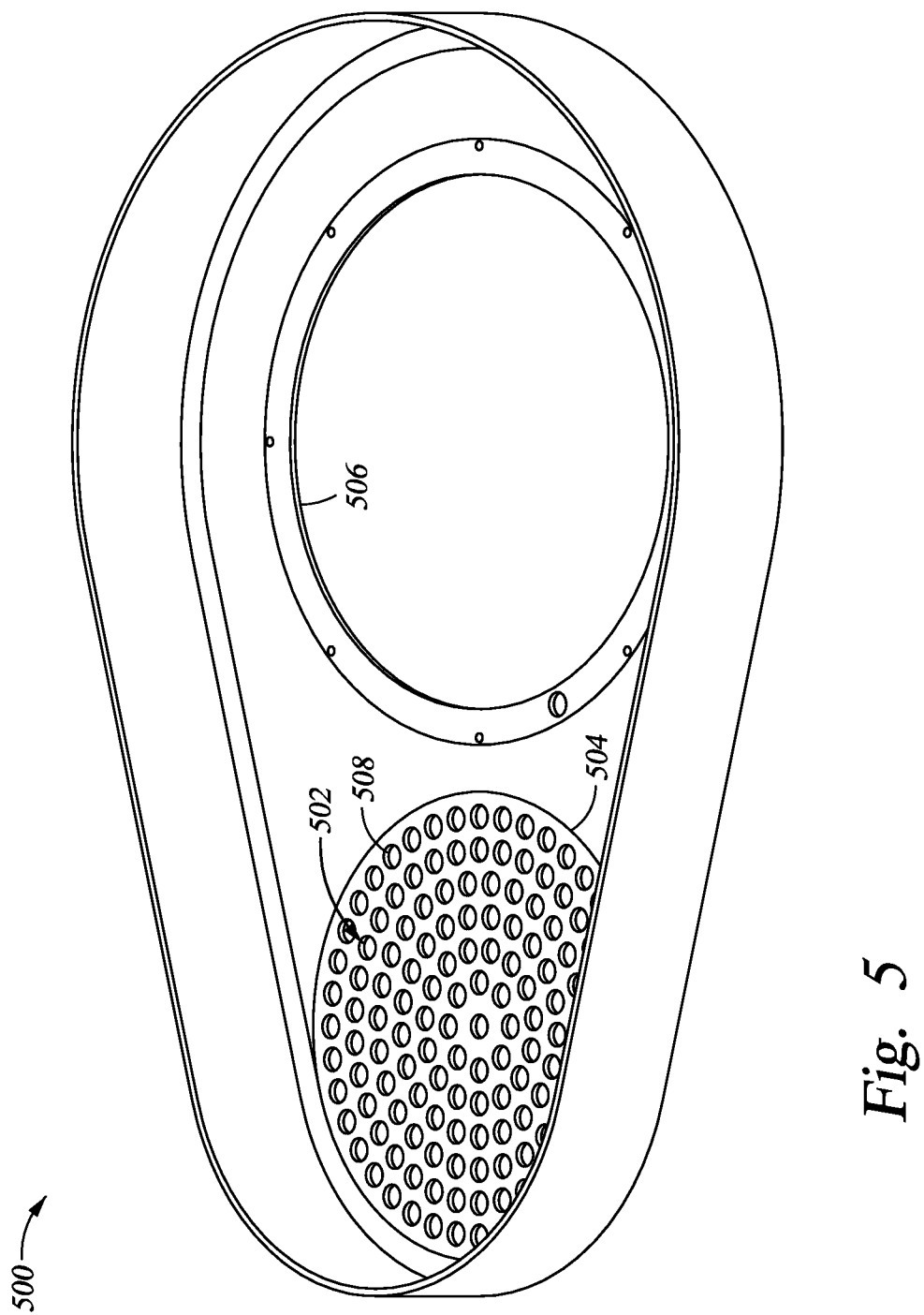
FIG. 5 is a schematic perspective view of a liner having a vacuum screen according to one embodiment of the present disclosure.

FIG. 5 is a schematic perspective view of a liner 500 having a vacuum screen 502 according to one embodiment of the present disclosure. The liner 500 is similar to the bottom liner 112 except the liner 500 includes a built-in vacuum screen 502 in a vacuum port 504. The liner 500 further includes a substrate support port 506 to receive a substrate support. The vacuum screen 502 may include a plurality of through holes 508 formed therethrough. The through holes 508 may be arranged and shaped as described in any one of the vacuum screen assemblies 160, 200, 300, 320 and 400 above. The liner 500 may be used alone to provide particle screen. Alternatively, one or more additional perforated plates, such as the planar plates described in the vacuum screen assemblies 160, 200, 300, 320 and 400, may be attached to the vacuum port 504 and stacked over the vacuum screen 502 to provide additional particle prevention.

Partially Perforated Liner

Figure 6A:
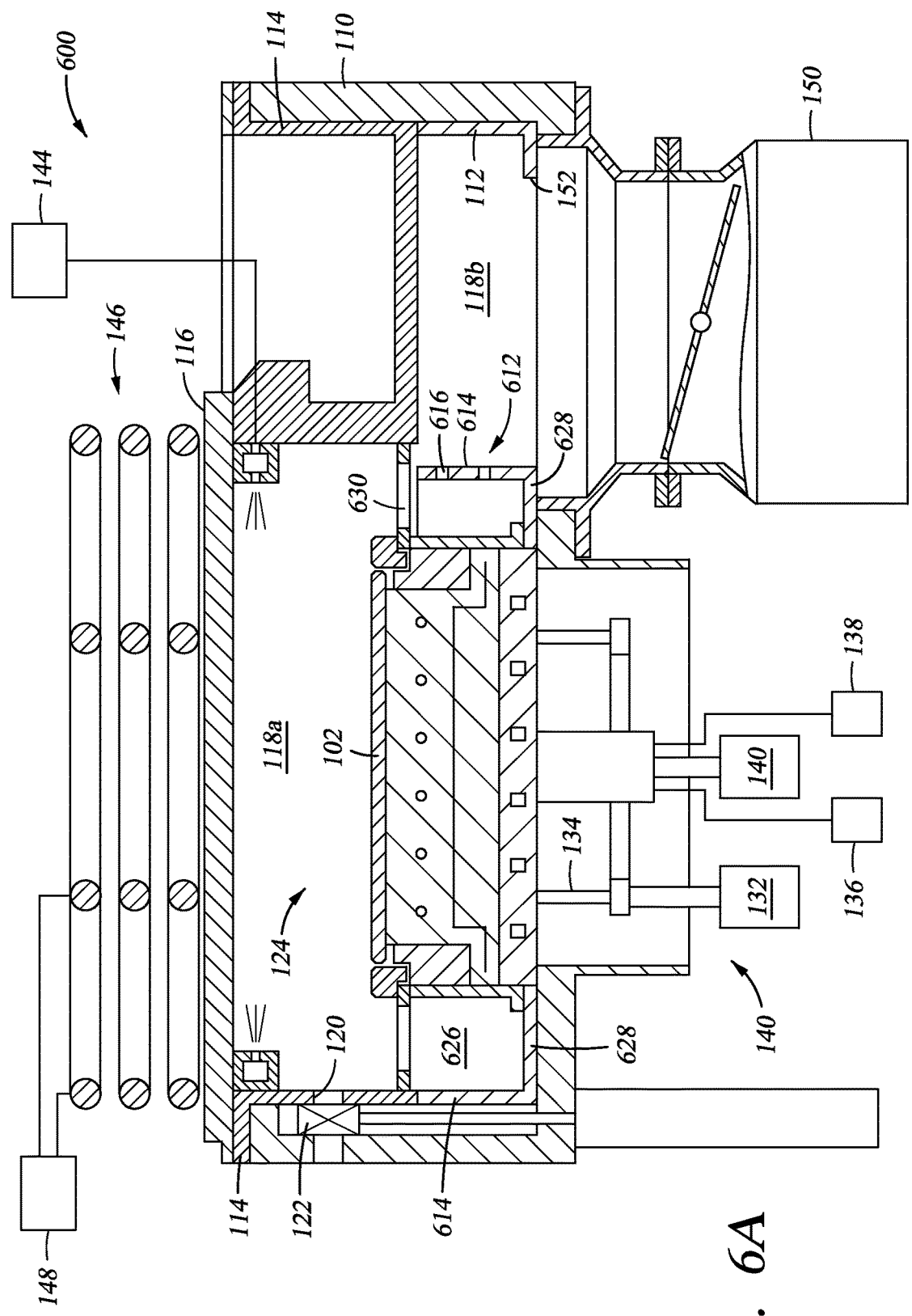
FIG. 6A is a schematic sectional view of a processing chamber having a partially perforated chamber liner according to one embodiment of the present disclosure.

FIG. 6A is a schematic sectional view of a processing chamber 600 having a partially perforated chamber liner 612 according to one embodiment of the present disclosure. The processing chamber 600 is similar to the processing chamber 100 except that the vacuum port 152 is open without a vacuum screen assembly disposed therein. The partially perforated chamber liner 612 provides both particle prevention from the vacuum port 152 and improvement of flow uniformity.

The chamber liner 612 includes a sidewall 614 extending upward from a bottom portion 618. In one embodiment, the sidewall 614 forms a closed loop to surround the substrate support assembly 124 therein. The sidewall 614 may raise up to a plasma screen 630. The sidewall 614, the plasma screen 630 and the liner 128 curve out a substantially symmetrical volume 626 around the substrate support assembly 124 from the lower volume 118b. A portion of the sidewall 614 facing the vacuum port 152 is perforated with a plurality of through holes 616. The plurality of through holes 616 provide fluid flow between the volume 626 and the vacuum port 152. In one embodiment, the plurality of through holes 616 are distributed non-uniformly to accommodate the non-symmetry between the vacuum port 152 and the substrate support assembly 124. In one embodiment, the non-uniform distribution of through holes 616 allows the plasma screen 630 to have uniform openings, thus, reducing the complexity of the plasma screen 630.

Figure 6B:
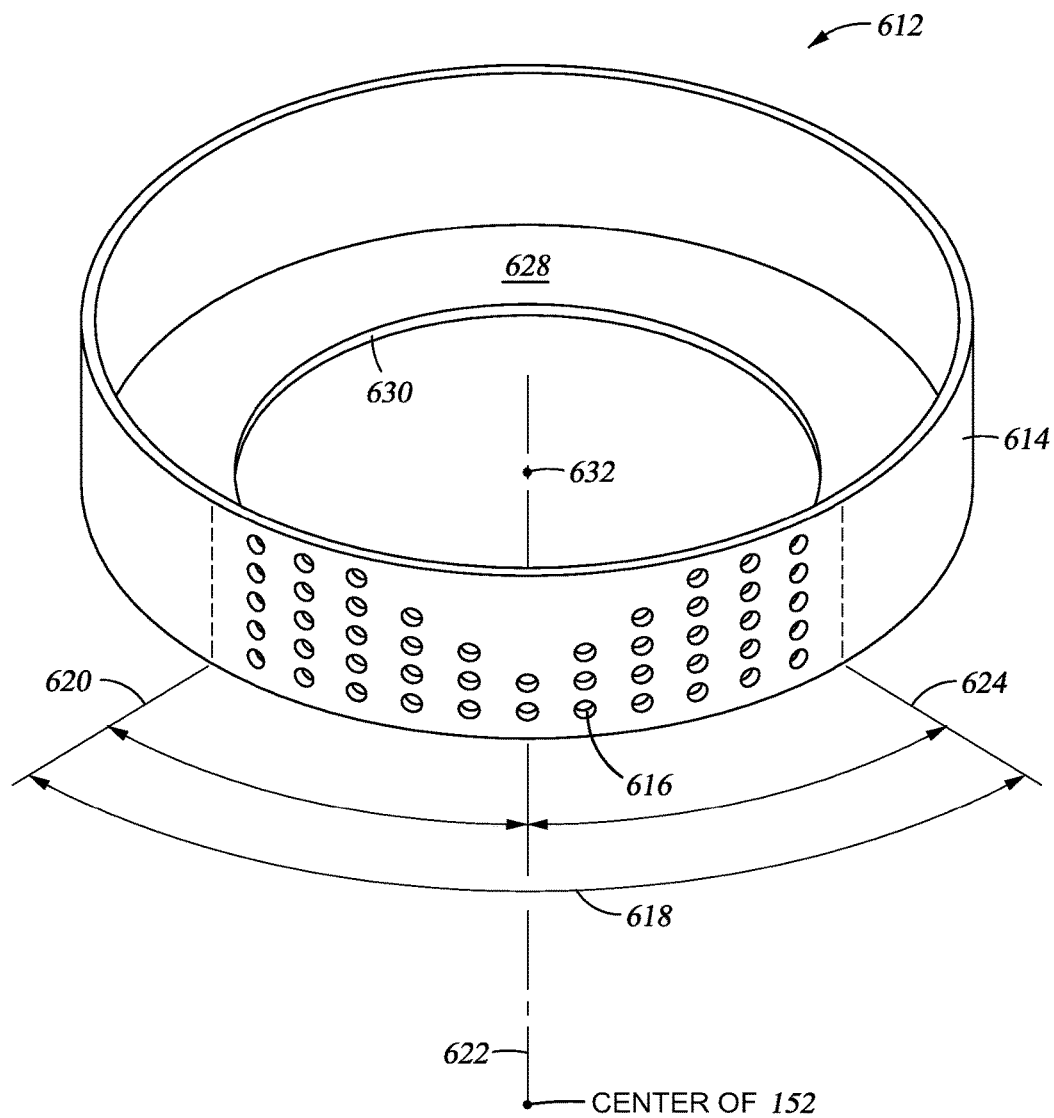
FIG. 6B is a schematic perspective view of a partially perforated chamber liner according to one embodiment of the present disclosure.

FIG. 6B is a schematic perspective view of the partially perforated chamber liner 612 according to one embodiment of the present disclosure. The sidewall 614 includes a perforated portion 618 starting from a first end 620, through a center line 622 to a second end 624. In one embodiment, the plurality of through holes 616 are distributed such that the number of through holes 616 per length of the perforated portion 618 decreases from the first end 620 to the center line 622 and increases from the center line 622 to the second end 624. In one embodiment, the plurality of through holes 616 are distributed symmetrical about the center line 622. When installed, the perforated portion 618 of the sidewall 614 is positioned to facing the vacuum port 152 so that the center line 622 aligns with a directly line connecting a center of the vacuum port 152 and a center 632 of a substrate support port 630 in the bottom portion 628.

Figure 6C:
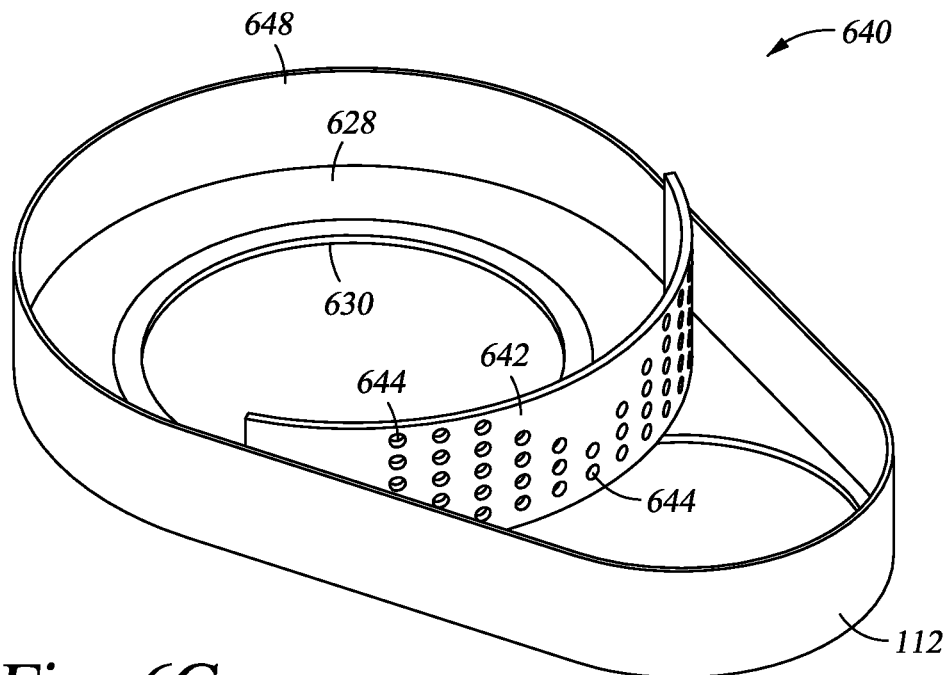
FIG. 6C is a schematic perspective view of a partially perforated chamber liner according to another embodiment of the present disclosure.

FIG. 6C is a schematic perspective view of a partially perforated chamber liner 640 according to another embodiment of the present disclosure. The chamber liner 640 is similar to the bottom liner 112 with a perforated baffle wall 642. The perforated baffle wall 642 is curved to form a complete circle 648 around the substrate support port 630 to surround the substrate support assembly 124. A plurality of through holes 646 are formed through the baffle wall 642. In one embodiment, the distribution of the through hole 646 may be non-uniform similar to the distribution of the through holes 616 described in FIG. 6B.

Figure 6D:
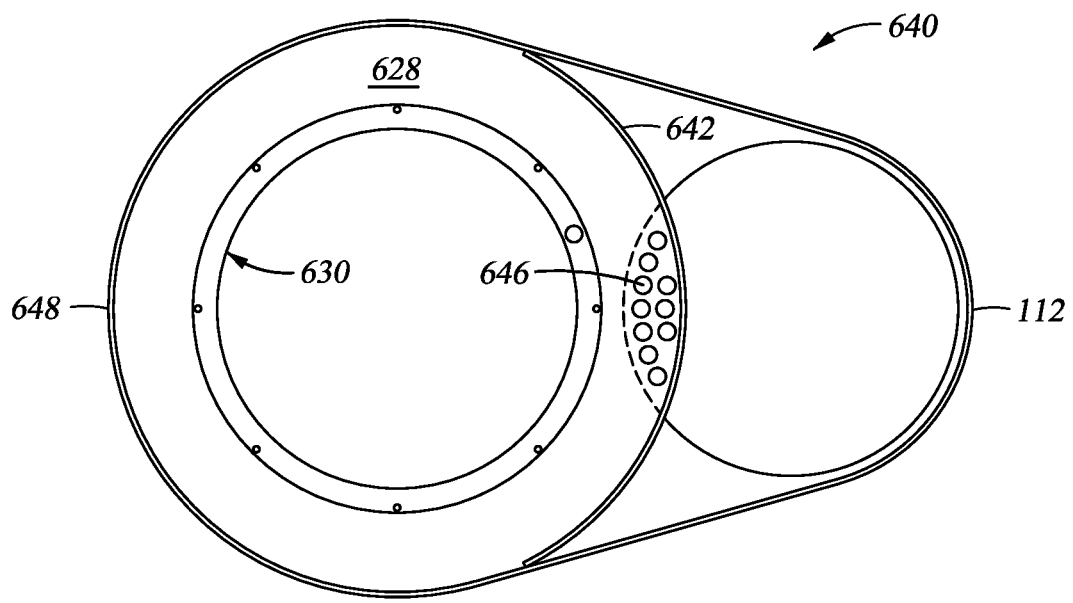
FIG. 6D is a schematic top view of the partially perforated chamber liner of FIG. 6C.

FIG. 6D is a schematic top view of the partially perforated chamber liner 640 of FIG. 6C. The circle 648 may overlap with the vacuum port 152. A plurality of through holes 646 may be formed through the bottom portion 628 that overlaps with the vacuum port 152 to provide paths for fluid flow with obstacles for blocking particles.

Gas Distributing Liner

Figure 7A:
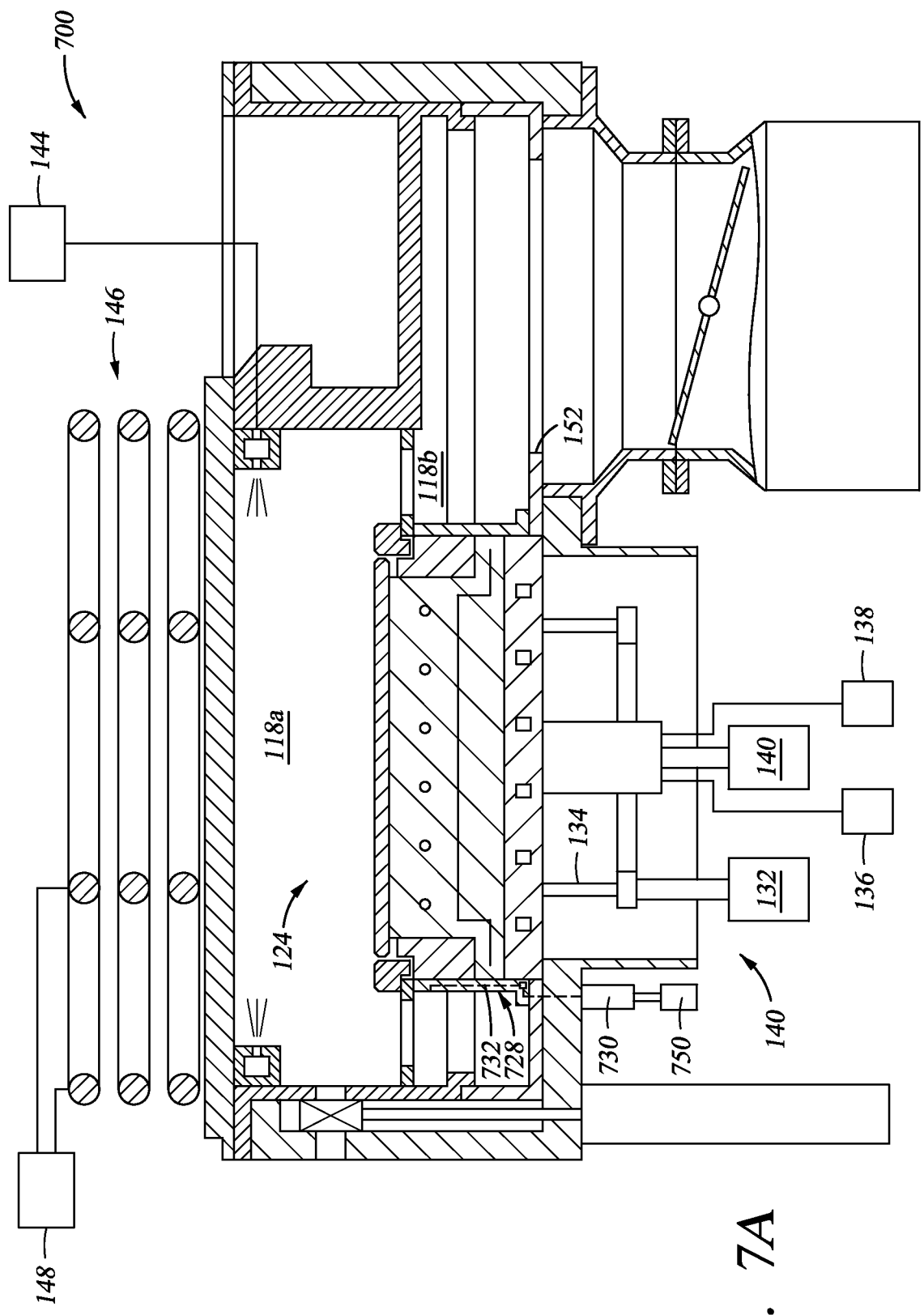
FIG. 7A is a schematic sectional view of a processing chamber having a gas distributing chamber liner according to one embodiment of the present disclosure.

FIG. 7A is a schematic sectional view of a processing chamber 700 having a gas distributing chamber liner 728 according to one embodiment of the present disclosure. The processing chamber 700 is similar to the processing chamber 100 except that the gas distributing chamber liner 728 is connected to an auxiliary gas injector 730. The auxiliary gas injector 730 may be connected to a cleaning gas source 750 for supplying a cleaning gas, such as fluorine or chlorine. In one embodiment, the gas source 750 may include a remote plasma source. The gas distributing chamber liner 728 may include fluid channel 732 formed therein to deliver a cleaning gas in the lower volume 118 around the substrate support assembly 124.

Figure 7B:
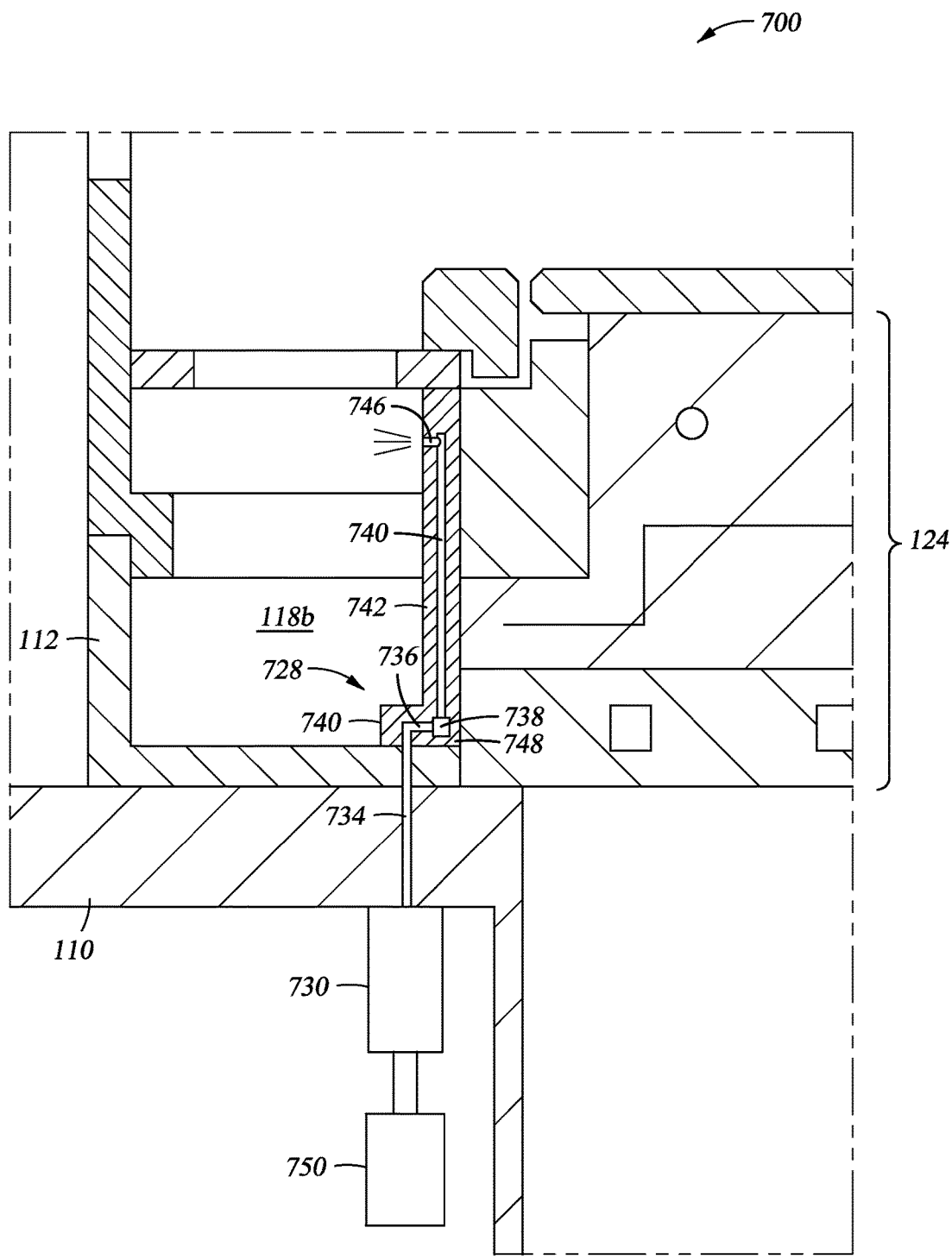
FIG. 7B is an enlarged partial view of the processing chamber of FIG. 7A.

FIG. 7B is an enlarged partial view of the processing chamber 700 of FIG. 7A. The gas distributing chamber liner 728 includes a gas connecting portion 740 having an inlet channel 736 to be coupled with the auxiliary gas injector 730 through a flow channel 734. The gas distributing chamber liner 728 also includes a ring shaped portion 748 and a sidewall 742 extending upward from the ring shaped portion 748. The ring shaped portion has a plenum 738 formed therein. The plenum 738 connects with the inlet channel 736. A plurality of distributing channels 744 are formed through the side wall 742. Each of the plurality of distributing channels 744 is connected between the plenum 738 to an outlet 746 positioned near the plasma screen 130. The outlets 746 are directed radially outwards from the substrate support assembly 124.

Figure 7C:
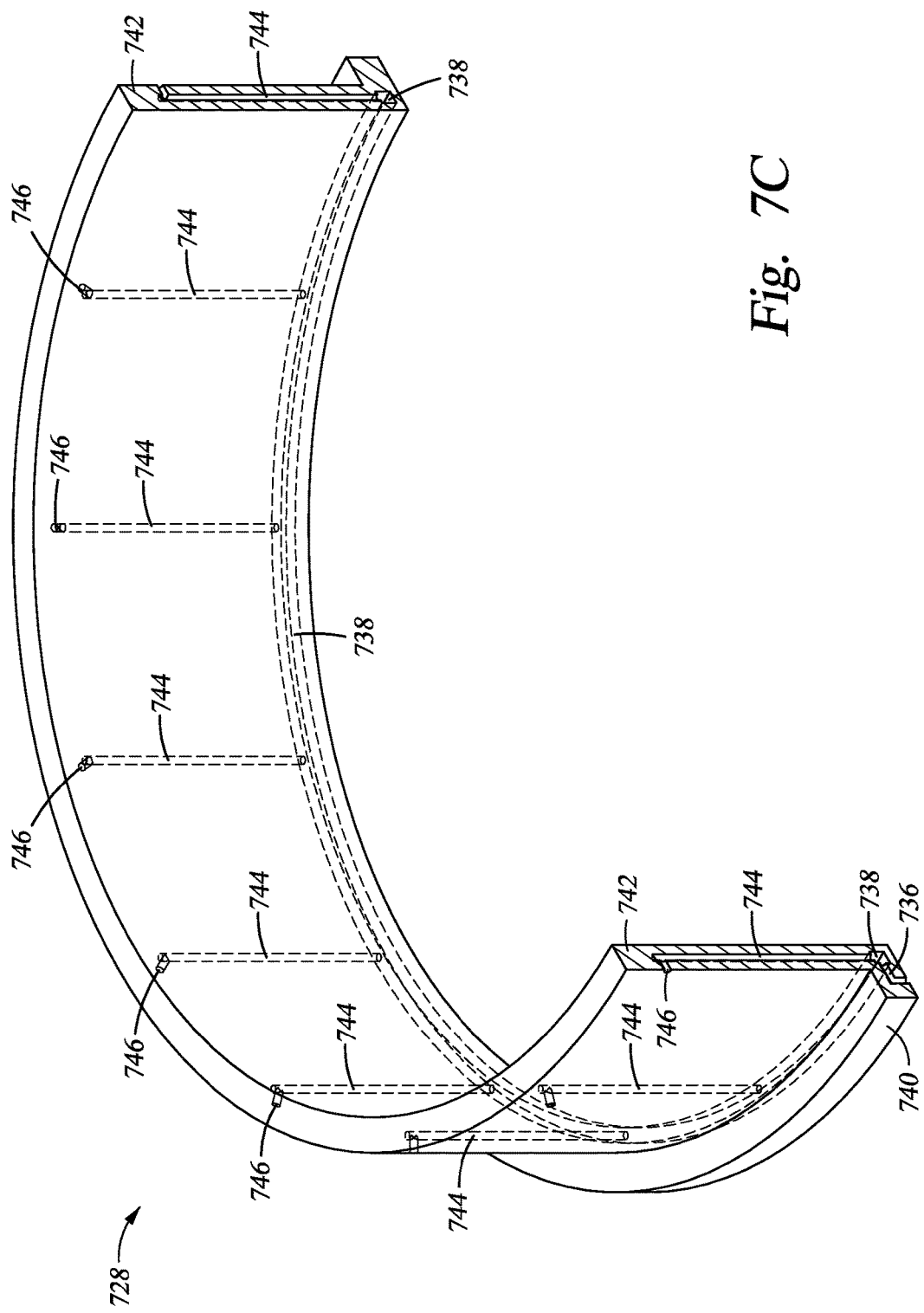
FIG. 7C is a schematic perspective partial sectional view of a gas distributing chamber liner according to one embodiment of the present disclosure.

FIG. 7C is a schematic perspective sectional view of the gas distributing chamber liner 728. The sidewall 742 may be circular. The plurality of distributing channels 744 are evenly distributed along the sidewall 742.

The gas distributing chamber liner 728 allows the lower volume 118b to be cleaned with a plasma, thus, further reducing particles. During cleaning, a cleaning gas, such as fluorine, chlorine, or other suitable cleaning gas, may be supplied to the plenum 738 from the auxiliary gas injector 730. The cleaning gas expands into the plenum 738 then travels upward long the plurality of distributing channels 744, then exits from the outlets 746 around the edge of the substrate support assembly 124 and just below the plasma screen 130. A plasma power, such as inductively coupled plasma power, may be applied to the processing chamber 700 in a manner similar to process the substrate 102 with a plasma formed above the substrate support surface 126. In one embodiment, enough radio frequency power may travel through the openings of the plasma screen 130 to ignite a plasma of the cleaning gas under the plasma screen 130 in the lower volume 118b. The lower volume 118 is therefore cleaned by the plasma. The cleaning process may be performed prior to, during or post substrate processing. The cleaning process may be performed with a substrate 102 in the processing chamber 700 or without a substrate in the processing chamber 700.

Embodiments of the present disclosure may be used alone or in combination. Even though plasma chambers are described in the above embodiments, vacuum screen assemblies and perforated chamber liners according to embodiments of the present disclosure may be used in any suitable chambers.

While the foregoing is directed to embodiments of the present disclosure, other and further embodiments of the disclosure may be devised without departing from the basic scope thereof, and the scope thereof is determined by the claims that follow.

The invention claimed is:

1. A vacuum screen assembly configured to be disposed between a processing chamber and a vacuum pump connected to the processing chamber, the vacuum screen assembly comprising:
    a first planar disk having a first plurality of through holes formed therethrough and two or more receiving openings on a side of the first planar disk facing the vacuum pump;
    a second planar disk stacked under the side of the first planar disk and facing the vacuum pump, wherein the second planar disk has a second plurality of through holes formed therethrough and two or more protrusions on a side of the second planar disk facing the first planar disk, wherein each of the two or more protrusions mates with one of the two or more receiving openings of the first planar disk, and wherein each of the first plurality of through holes at least partially align with a respective one of a second plurality of through holes and is tilted at an opposite direction from the respective one of the second plurality of through holes to form chevron shaped flow paths which reduce a line of sight from the processing chamber to the vacuum pump.

2. The vacuum screen assembly of claim 1, further comprising:
    a third planar disk; and
    a fourth planar disk stacked under the third planar disk, wherein a plurality of chevron shaped flow paths are formed through the third planar disk and the fourth planar disk, and the first and second planar disks are stacked over the third and fourth planar disks and closer to the processing chamber to form a plurality of zigzagging flow paths, wherein the zigzagging flow paths comprise the chevron shaped flow paths through the first and second planar disks aligned with the chevron shaped flow paths through the third and fourth planar disks.

* * * * *